US006753729B2

United States Patent
Broadley

(10) Patent No.: US 6,753,729 B2
(45) Date of Patent: Jun. 22, 2004

(54) SELF-OSCILLATING VARIABLE FREQUENCY CLOSED LOOP CLASS D AMPLIFIER

(75) Inventor: Simon J. Broadley, Gilbert, AZ (US)

(73) Assignee: Mitek Corporation, Tempe, AZ (US)

( * ) Notice: Subject to any disclaimer, the term of this patent is extended or adjusted under 35 U.S.C. 154(b) by 0 days.

(21) Appl. No.: 09/478,578

(22) Filed: Jan. 6, 2000

(65) Prior Publication Data
US 2002/0033734 A1 Mar. 21, 2002

(51) Int. Cl.[7] .............................. H03F 3/38; H03F 3/217
(52) U.S. Cl. ...................... 330/207 A; 330/251; 330/10
(58) Field of Search ............................... 330/10, 207 A, 330/251

(56) References Cited

U.S. PATENT DOCUMENTS

| 4,649,467 A | * | 3/1987 | Vesce et al. ................. 330/251 |
| 4,649,565 A | * | 3/1987 | Kaizer et al. ................ 330/127 |
| 4,673,889 A | * | 6/1987 | Cini et al. ..................... 330/10 |
| 5,352,986 A | * | 10/1994 | Modgil et al. ................ 330/10 |
| 5,410,592 A | * | 4/1995 | Wagner et al. ............... 330/251 |
| 5,521,549 A | * | 5/1996 | Nelson ......................... 330/10 |
| 5,805,020 A | * | 9/1998 | Danz et al. .................... 330/10 |
| 5,838,193 A | * | 11/1998 | Myers et al. .................. 330/10 |
| 5,949,282 A | * | 9/1999 | Nguyen et al. ......... 330/207 A |
| 5,986,498 A | * | 11/1999 | Rodriguez .............. 330/207 A |
| 6,016,075 A | * | 1/2000 | Hamo ......................... 330/10 |
| 6,091,292 A | * | 7/2000 | Higashiyama et al. .. 330/207 A |
| 6,107,875 A | * | 8/2000 | Pullen et al. .................. 330/10 |
| 6,118,336 A | * | 9/2000 | Pullen et al. .................. 330/10 |
| 6,229,388 B1 | * | 5/2001 | Nalbant .................. 330/207 A |
| 6,249,182 B1 | * | 6/2001 | Pullen .................... 330/207 A |

* cited by examiner

Primary Examiner—Robert Pascal
Assistant Examiner—Khanh Van Nguyen
(74) Attorney, Agent, or Firm—Tod R. Nissle, P.C.

(57) ABSTRACT

An improved Class D amplifier which does not utilize a clock, is self-oscillating, and reduces switching errors and distortions. The amplifier includes positive and negative switches which are selectively activated to reduce errors in gain in the analog signal produced by the amplifier.

3 Claims, 3 Drawing Sheets

SELF-OSCILLATING VARIABLE FREQUENCY CLOSED LOOP CLASS D AMPLIFIER

FIELD OF THE INVENTION

This invention pertains to amplifiers.

More particularly, the invention pertains to an improved Class D amplifier which does not utilize a clock, which is self-oscillating, and which reduces switching errors and distortions.

BACKGROUND OF THE INVENTION

Conventional Class D amplifiers are each comprised of an integrator summed with a fixed frequency triangle wave and inputted into the switch control. The switching waveform is filtered through a Low Pass Filter (LPF) and outputted to the speaker or other load. Such amplifiers are illustrated in FIGS. 1 to 3 of U.S. Pat. No. 4,415,863, and have certain disadvantages.

First, the clock frequency in the amplifiers is fixed, resulting in a constant, large, high frequency component that can potentially create noise in FM tuners, switching power supplies, or other parts of an audio system.

Second, the clock frequency is generally selected to optimize operation under heavy load conditions. As a result, when an audio signal input is not applied, poor signal to noise ratio measurements are produced.

Third, the feedback is such prior art systems is taken prior to the low pass filter. This makes it difficult to control the speaker because a nonlinear generation of the sine wave is produced as the load of the speaker changes impedance. This causes poor total harmonic distortion and poor noise and damping factor measurements.

Accordingly, it would be highly desirable to provide an improved Class D amplifier which would compensate for problems caused by a fixed clock frequency and which would yield better speaker control.

Therefore, it is a principal object of the invention to provide an improved Class D amplifier.

A further object of the instant invention is to provide an improved Class D amplifier which reduces the likelihood that excess noise will be created in remaining portions of an audio system used in combination with the Class D amplifier.

Another object of the invention is to provide an improved Class D amplifier which enables better control of a speaker receiving an analog signal from the amplifier.

BRIEF DESCRIPTION OF THE DRAWINGS

These and other, further and more specific objects and advantages of the invention will be apparent to those skilled in the art from the following detailed description thereof, taken in conjunction with the drawings, in which.

SUMMARY OF THE INVENTION

Briefly, in accordance with the invention, I provide an improved self-oscillating audio Class D amplifier for an input signal. The amplifier includes a detector for receiving a control signal and producing a digital waveform switching signal to activate one of a pair including a positive switch and a negative switch to correct gain produced by the Class D amplifier; an output stage including a positive switch and a negative switch, the output stage receiving the switching signal and activating one of the switches to produce a digital driving signal; an output filter to receive the digital driving signal, remove switching noise and provide an amplified audio analog output signal to drive a load; and, an error detection amplifier circuit to receive the amplified analog output signal and compare the output signal to the input audio signal for gain-correction purposes, and to produce the control signal.

DETAILED DESCRIPTION OF THE PREFERRED EMBODIMENTS

Figure 1:
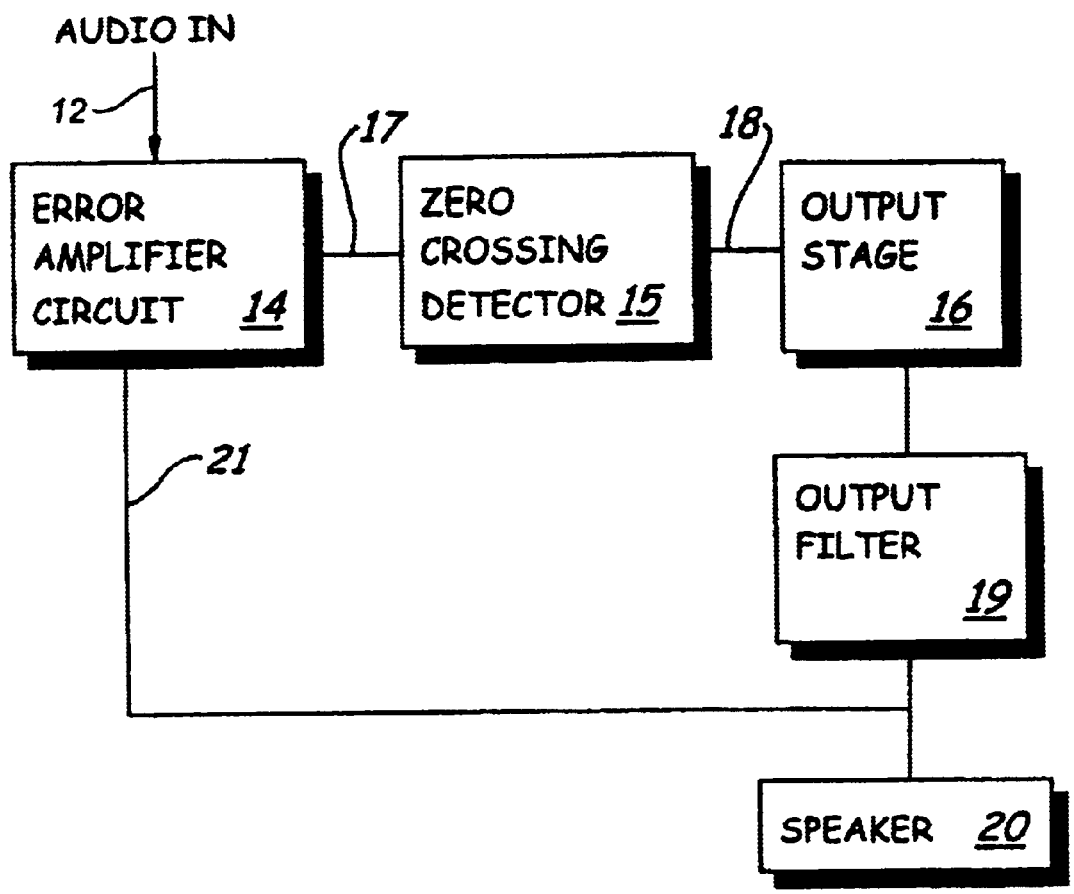
FIG. 1 is a block diagram illustrating a Class D amplifier constructed in accordance with the principles of the invention.

Turning now to the drawings, which depict the presently preferred embodiments of the invention for the purpose of illustrating the practice thereof and not by way of limitation of the scope of the invention, and in which like reference characters refer to corresponding elements throughout the several views, FIG. 1 illustrates a Class D amplifier constructed in accordance with the principles of the invention and including error amplifier circuit 14, zero cross detector 15, output stage 16, output filter 19, feedback signal 21, and speaker 20 or another load. Circuit 14 produces an ADJ OUT control signal 17. Detector 15 produces a DIG OUT signal 18.

Figure 2:
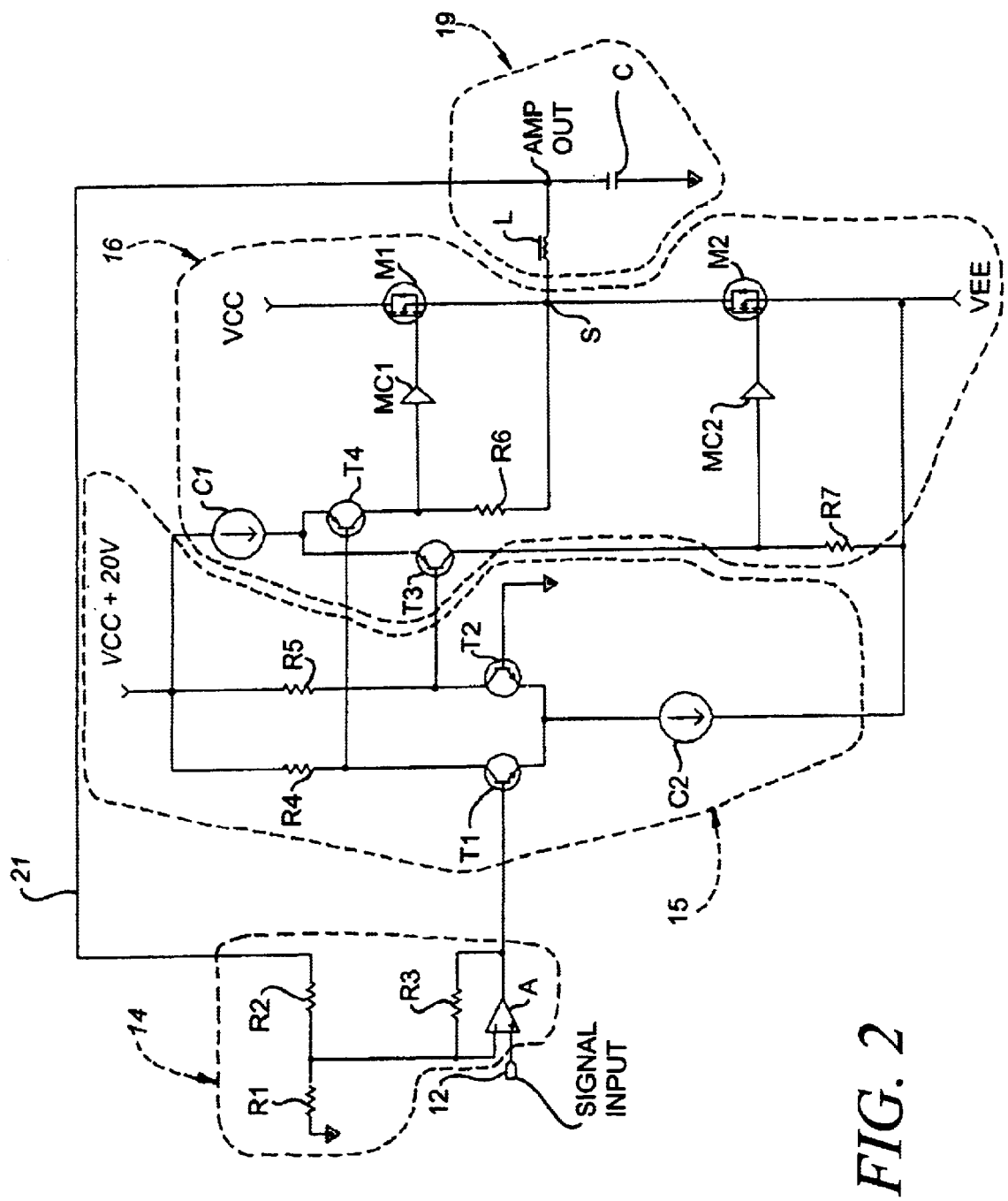
FIG. 2 is a circuit diagram illustrating the amplifier of FIG. 1.

In the circuit diagram of FIG. 2, the error amplifier circuit 14 includes resistors R1, R2, R3 and amplifier A. The zero crossing detector 15 includes VCC+20V, includes resistors R4, R5, includes current source C2, and includes transistors T1, and T2. The output stage 16 includes MOSFET switches M1 and M2, the driver circuitry MC1 for MOSFET switch M1, the driver circuitry MC2 for MOSFET switch M2, power supply VCC, power supply VEE, transistors T3 and T4, current source C1, and resistors R6 and R7. The output filter 19 includes inductor L, capacitor C, and AMP OUT.

In operation, an audio analog input signal 12 is fed into an error amplifier circuit 14 that adjusts the signal and produces a digital ADJ OUT signal 17. The ADJ OUT control signal 17 is a step response PWM waveform.

The signal ADJ OUT control 17 is received by zero crossing detector 15 and transformed into a high frequency digital DIG OUT signal 18. In this respect, zero crossing detector 15 functions as a pulse width modulator.

The zero crossing detector 15 also separates out positive and negative signals and determines whether the high side MOSFET switch M1 is turned on or whether the low side MOSFET switch M2 is turned on. MOSFET switch M1 is connected to the positive rail. MOSFET switch M2 is connected to the negative rail. Consequently, if the voltage is positive, detector 15 turns on the high side positive switch M1. If the voltage is negative, detector 15 turns on the low side negative switch M2. While the circuit is operating, switches M1 and M2 toggle back and forth continuously. Zero crossing detector 15 alternates between the M1 and M2 switches but does not allow both switches to be on at the same time.

The output of the zero crossing detector 15 controls the switches M1 and M2 in the output stage 16.

The high frequency digital signal (DGI OUT) 18 is received by the output stage 16. When signal 18 activates positive switch M1, switch M1 is connected to summing point S and is pulled up to VCC. When signal 18 activates negative switch M2, switch M2 is connected to summing point S and is pulled down to VEE. VCC is a positive power supply which produces, by way of example and not limitation, 50 volts to 100 volts. VEE is a negative power supply which produces, by way of example and not limitation, minus 50 to minus 100 volts.

Figure 3:
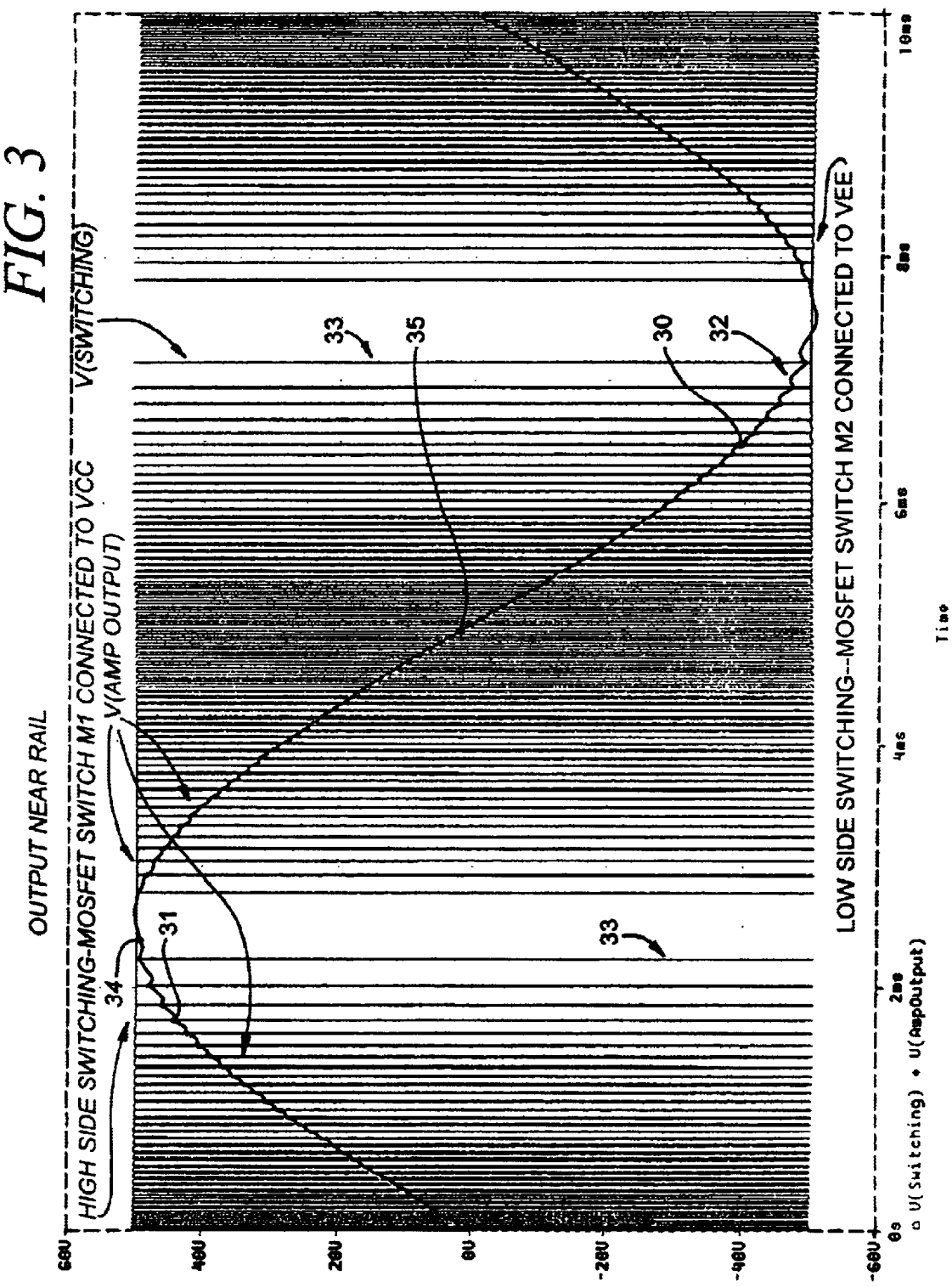
FIG. 3 is a Spice diagram illustrating the analog signal produced by the Class D amplifier superimposed on the square wave generated in the amplifier prior to production of the analog signal.

The analog signal coming out of the output filter 19 is a sine wave 32. In FIG. 3 sine wave 32 is superimposed on the switching square wave 33. Square wave 33 represents the switching between MOSFET switches M1 and M2. The width of a pulse in square wave 33 is the length of the horizontal portion at the top or bottom of the pulse. Consequently, the width of the pulse when sine wave 32 output is at about 50V (as indicated by point 34) is, in FIG. 3, much longer than the width of the pulse when the sine wave output is at about 0 V (as indicated by point 35).

The signal from the output stage 16 is received by the output filter 19.

The output filter 19 removes high frequency components (include switching noise) having frequencies in the range of about 10 KiloHertz to 250 KiloHertz. The resulting low frequency sine wave signal which leaves filter 19 typically has a frequency in the range of about 20 Hertz to 200 Hertz. Filter 19 also converts the digital signal from stage 16 back into an analog signal capable of driving an external load like speaker 20. The output signal from filter 19 is an amplified version of the audio input signal. The output signal from filter 19 typically has a gain in the range of five to fifteen, although the gain can vary as desired.

Feedback 21 is taken from the signal produced by output filter 19. The feedback 21 is returned to a difference amplifier in the error amplifier circuit 14. The difference amplifier compares the amplitudes and phase relationships of the feedback 21 and of the audio in signal 12. Resistors R1 and R2 function to compensate for the gain in the feedback signal such that the feedback signal is divided down by resistors R1 and R2 and then passes into the difference amplifier, and such that the divided down feedback signal has an amplitude and phase which ideally is identical to the amplitude and phase of the audio in signal 12.

If the amplitude of the divided down feedback signal is not equivalent to that of the audio in signal, then the error amplifier circuit 14 sends a counter pulse or control signal 17 to compensate. For example, if the feedback signal 21 (after being divided down by resistors R1 and R2) indicates that the positive voltage is too low (i.e., the gain with respect to the audio signal 12 input to circuit 14 is 9.9 to 1.0 instead of a desired 10.0 to 1.0, or, in other words the voltage output from output filter 19 for a point along sine wave 32 is not as great as desired) then the counter pulse from circuit 14 activates transistors T1 and T4 to hold switch M1 on or closed until the feedback signal indicates that the gain is at least 10.0 (or greater than 10.0) to 1.0.

If the feedback signal 21 (after being divided down by resistors R1 and R2) indicates that the positive voltage is too high (i.e., the gain with respect to the audio signal 12 input to circuit 14 is 10.1 to 1.0 instead of a desired 10.0 to 1.0, or, in other words the voltage output from output filter 19 for a point along sine wave 32 is greater than desired) then the counter pulse from circuit 14 activates transistors T2 and T3 to hold switch M2 on or closed until the feedback signal indicates that the gain is at least 10.0 (or less than 10.0) to 1.0.

If the feedback signal 21 indicates that the negative voltage is too high (i.e., the gain is 10.1 to 1.0 instead of 10.0 to 1.0), then the counter pulse from circuit 14 activates transistors T1 and T4 to hold switch M1 on or closed until the feedback signal indicates that the gain is 10.0 (or less than 10.0) to 1.0.

If the feedback signal 21 indicates that the negative voltage is too low (i.e., the gain is 9.8 to 1.0 instead of 10.0 to 1.0), then the counter pulse from circuit 14 activates transistors T2 and T3 to hold switch M2 on or closed until the feedback signal indicates that the gain is 10.0 (or greater than 10.0) to 1.0.

If the error is small, i.e. if the gain is 10.0 or is close to 10.0, then width of pulses in the square wave signal 33 leaving the output stage 16 is small and the pulses leave stage 16 at a higher frequency.

If the error is large, i.e. if the gain is not close to 10.0 (but is, for example 10.3), then the width of pulses in the square wave signal 33 leaving the output stage 16 is larger and the pulses leave stage 16 at a lower frequency.

By way of further example, if after comparing the feedback signal 21 to the input signal 12, the error amplifier circuit 14 determines that at point 31 on the sine wave 32 the voltage is 50 volts instead of the desired 51 volts, circuit 14 compensates by turning on switch M1 until the voltage on sine wave 32 increases to a desired level.

By way of further example, if after comparing the feedback signal 21 to the input signal 12, the error amplifier circuit 14 determines that at point 30 on the sine wave 32 the voltage is at minus 41 volts instead of the desired minus 39 volts, the circuit 14 compensates by turning on switch M1 until the voltage on sine wave 32 "decreases" from minus 41 volts to the desired minus 39 volts.

By way of further example, if power supply VCC produces 100 volts, if the signal produced by filter 19 is producing positive voltage with a gain of nine with respect to input signal 12, and if a gain often is desired, then circuit 14 produces a positive signal to turn on switch M1 until the gain increases to ten. If the gain happens to increase past ten to, for example, 10.1, then circuit 14 produces a negative signal to turn on switch M2 until the gain for the positive voltage decreases back to ten. This automatic "self oscillating" or "hunting" pattern eventually typically results in there only being a small error between the actual gain in the signal leaving filter 19.

A classic Class D amplifier has a built in clock and constantly switches.

One primary advantage of the Class D amplifier of the invention is that it does not utilize or require a clock and does not require the additional parts necessary to produce a clock signal.

As would be appreciated by those of skill in the art, constant currents sources C1 and C2 constantly deliver current for the availability of other electronic components.

When it is desired to turn on MOSFET switch M1, error amplifier circuit 14 produces a positive signal which turns on transistor T1 and pulls current through resistor R4 and transistor T4 resutling in current sourced to resistor R6 generating a voltage for the buffer MC1.

When it is desired to turn on MOSFET switch M2, error amplifier circuit 14 produces a negative signal which turns on transistor T2 and pulls current through resistor R5 and transistor T3 resulting in current sourced to resistor R7 generating a voltage for the buffer MC2.

A buffer or any other desired circuitry can be utilized in MC1 and MC2 to drive switches M1 and M2. If desired a transistor, IGBL or other switch can be utilized in place of switches M1 and M2. A transformer or other switch activation means can be utilized in place of transistors T1 to T4.

Filter 19 can be a two pole filter, four pole filter, six pole filter, or any other filter means which performs the function of removing high frequencies and producing an analog signal for a speaker or other load.

As the magnitude of the error between the desired gain produced by the amplifier of the invention increases, operation of the amplifier circuit slows. In particular, when a switch M1, M2 is held open to compensate for an error, current ramps up through inductor L, voltage ramps up through capacitor C, and voltage ramps up at the AMP OUT intermediate the inductor L and capacitor C. The time required to ramp up current or voltage, as the case may be, slows operation of the circuit and facilitates large error corrections. Slowing down the operation of the circuit also improves the efficiency of the circuit by not forcing the circuit to continually switch, which generates additional switching losses.

When switching is occurring and is producing the square wave pattern shown in FIG. 3, the amplifier circuit of the invention allows the output stage 16 to latch to the power supply rail, reducing the frequency of operation so that it equals the frequency of operation of the input. Such latching minimizes switching dissipation and maximizes the possible output of the system.

When the magnitude of the error between the desired gain and gain actually produced in the signal exiting filter 19 is at a minimum, the frequency of switching increases and the width of each pulse decreases due to the minimal amount of correction necessary to maintain proper output. This "speeding up" helps maintain low noise performance when little or no signal is applied. This increase in noise performance is a by-product of the increased switching speed being filtered more efficiently by the output filter.

Having described my invention in such terms as to enable those of skill in the art to make and practice it, and having described the presently preferred embodiments thereof, I claim:

1. An audio Class D amplifier, comprising
   (a) a detector for receiving a PWM waveform control signal and producing a digital waveform switching signal to activate one of a pair including a positive switch and a negative switch to correct gain produced by the Class D amplifier;
   (b) an output stage including a positive switch and a negative switch comprising a single switching output, said output stage receiving said switching signal and activating one of said switches to produce a variable switching non-continuous digital driving signal;
   (c) an output filter to receive said digital driving signal, remove switching noise and provide an amplified non-inverting audio analog output signal to drive a load;
   (d) a non-inverting, closed loop negative feedback error amplifier circuit to
      (i) receive said amplified analog output signal and compare said output signal to said input signal for gain-correction purposes, and
      (ii) produce said PWM waveform control signal;
   said amplifier self-oscillating.

2. An audio Class D amplifier, comprising
   (a) a detector for receiving a PWM waveform control signal and producing a digital waveform switching signal to activate one of a pair including a positive switch and a negative switch to correct gain produced by the Class D amplifier;
   (b) an output stage including a positive switch and a negative switch comprising a single switching output, said output stage receiving said switching signal and activating one of said switches to produce a variable switching non-continuous digital driving signal;
   (c) an output filter to receive said digital driving signal, remove switching noise and provide an amplified non-inverting audio analog output signal to drive a load;
   (d) a non-inverting, closed loop negative feedback error amplifier circuit to
      (i) receive said amplified analog output signal and compare said output signal to said input signal for gain-correction purposes, and
      (ii) produce said PWM waveform control signal;
   the operation of said amplifier slowing as the magnitude of the error in gain increases, said amplifier self-oscillating.

3. An audio Class D amplifier, comprising
   (a) a variable frequency zero crossing detector for receiving a PWM waveform control signal and producing a digital waveform switching signal to activate one of a pair including a positive switch and a negative switch to correct gain produced by the Class D amplifier;
   (b) an output stage including a positive switch and a negative switch comprising a single switching output, said output stage receiving said switching signal and activating one of said switches to produce a variable switching non-continuous digital driving signal;
   (c) an output filter to receive said digital driving signal, remove switching noise and provide an amplified non-inverting audio analog output signal to drive a load;
   (d) a non-inverting, closed loop negative feedback, error amplifier circuit to
      (i) receive said amplified analog output signal and compare said output signal to said input signal for gain-correction purposes, and
      (ii) produce said PWM waveform control signal;
   the operation of said amplifier slowing as the magnitude of the error in gain increases, said amplifier self-oscillating.

* * * * *